(12) United States Patent
Li et al.

(10) Patent No.: US 12,107,573 B2
(45) Date of Patent: Oct. 1, 2024

(54) SUPER SOURCE FOLLOWER WITH FEEDBACK RESISTOR AND INDUCTIVE PEAKING

(71) Applicant: Avago Technologies International Sales Pte. Limited., Singapore (SG)

(72) Inventors: Guansheng Li, Irvine, CA (US); Delong Cui, Tustin, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 246 days.

(21) Appl. No.: 17/718,139

(22) Filed: Apr. 11, 2022

(65) Prior Publication Data

US 2023/0327663 A1  Oct. 12, 2023

(51) Int. Cl.
*H03K 17/60* (2006.01)
*H04B 10/40* (2013.01)

(52) U.S. Cl.
CPC ........... *H03K 17/602* (2013.01); *H04B 10/40* (2013.01)

(58) Field of Classification Search
CPC .................................................. H03K 17/602
USPC ............................................................ 327/538
See application file for complete search history.

(56) References Cited

U.S. PATENT DOCUMENTS

| 6,124,740 A | 9/2000 | Klemmer |
| 6,552,605 B1 | 4/2003 | Yoon |
| 7,408,409 B1 | 8/2008 | Kern |
| 7,733,965 B2 | 6/2010 | Hershbarger |
| 10,582,309 B2 | 3/2020 | Saman et al. |

FOREIGN PATENT DOCUMENTS

| CN | 103532497 A | 1/2014 |
| WO | WO-2019048065 A1 * | 3/2019 |

OTHER PUBLICATIONS

Giannini, F., et al, "Improved single-ended solutions for ultrawideband monolithic GaAs amplifiers", 1997 (Year: 1997).*
H. Shih and C. Wang, "A Highly-Integrated 3-8 GHz Ultra-Wideband RF Transmitter With Digital-Assisted Carrier Leakage Calibration and Automatic Transmit Power Control," in IEEE Transactions on Very Large Scale Integration (VLSI) Systems, vol. 20, No. 8, pp. 1357-1367, Aug. 2012, doi: 10.1109/TVLSI.2011.2157842.
Extended European Search Report, EP Application No. 23166764.3, European Patent Office, mailed on Sep. 5, 2023, 12 pages.
Giannini et al., Improved single-ended solutions for ultrawide-ban monolithic GaAs amplifiers, IEEE, vol. 144, No. 6, Dec. 8, 1997, pp. 458-466.

* cited by examiner

*Primary Examiner* — Tomi Skibinski
(74) *Attorney, Agent, or Firm* — Quarles & Brady LLP

(57) ABSTRACT

A system including a source follower circuit is disclosed. The source follower circuit configured as a voltage buffer that includes a first common-drain transistor that passes an input signal at the gate to an output loading capacitor at the source, and a second common-drain transistor that is used as a bias current source. The source follower circuit includes a first resistor at the drain of the first transistor generating a first voltage that is fed back through a first path through the gate of the second transistor so as to produce additional current to help the output signal catch up with the input voltage. The source follower circuit further includes an inductive element and bias circuit, which along with the first resistor, increases bandwidth and reduced settling time.

20 Claims, 11 Drawing Sheets

SUPER SOURCE FOLLOWER WITH FEEDBACK RESISTOR AND INDUCTIVE PEAKING

BACKGROUND

Broadband buffers that deliver high-speed signals during heavy loading are critical to data communication componentry, such as high-speed serializer/deserializers (SerDes) and analog digital converters (ADCs). These buffers need to achieve large bandwidth and settle fast when the signal toggles. The process, voltage and temperature variation of these buffers must be minimized to give robust performance. However, existing circuit structures, such as source followers and super source followers, are not able to achieve high signal bandwidth and short settling times that are required by next generation signaling and coherent optical products. Accordingly, it is desirable to provide a buffer circuit that provides more robust signaling than conventional approaches.

SUMMARY

A system is disclosed. In one or more embodiments, the system includes a source follower circuit. In one or more embodiments, the source follower circuit includes a first transistor. In one or more embodiments, the transistor includes a first gate terminal configured to receive a first voltage via a first input line. In one or more embodiments, the first transistor further includes a first source terminal coupled to a first end of a first source line. In one or more embodiments, the first transistor further includes a first drain terminal coupled to a first end of a first drain line. In one or more embodiments, the source follower circuit further includes a second transistor. In one or more embodiments, the second transistor includes a second gate terminal configured to receive a second voltage via a first end of a second input line. In one or more embodiments, the second transistor further includes a second source terminal. In one or more embodiments, the second transistor further includes a second drain terminal coupled to a first end of a second drain line. In one or more embodiments, the source follower circuit further includes an output junction formed from a second end of the first source line, and a second end of the second drain line. In one or more embodiments, the source follower circuit further includes a feedback subcircuit comprising a first path coupled to the first end of the first drain line and coupled to the second input line.

In some embodiments, the source follower circuit further includes a bias circuit coupled to the second input line configured to receive a bias current and send the second voltage to the second gate terminal.

In some embodiments of the system, the bias circuit includes a third transistor. In some embodiments, the third transistor includes a third fate terminal coupled to the second input line. In some embodiments, the third transistor further includes a third source terminal. In some embodiments, the third transistor further includes a third drain terminal coupled to a third drain line. In some embodiments, the third drain line is configured to receive the bias current. In some embodiments, the bias circuit further includes a second path coupled to the third drain line and the second input line. In some embodiments, the bias circuit further includes a second resistor (e.g., bias resistor) disposed between the third gate terminal and the second gate terminal.

In some embodiments, the source follower circuit further includes a first resistor coupled to the first drain line configured to generate a first voltage. In some embodiments, the first voltage drives the second gate terminal.

In some embodiments, the first resistor is configured as a calibrated resistor.

In some embodiments, the source follower circuit further includes an inductive element coupled to the feedback subcircuit configured to perform an inductive peaking operation.

In some embodiments, the inductive element is configured as an inductive coil.

In some embodiments, the source follower circuit further comprises a first resistor coupled to the first drain line configured to generate a first voltage, wherein the first voltage drives a gate terminal of the second transistor.

In some embodiments, the source follower circuit further includes an inductive element coupled to the feedback subcircuit configured to perform an inductive peaking operation.

In some embodiments, the system further includes an integrated circuit, wherein the source follower circuit is integrated into the integrated circuit.

In some embodiments, the system further includes a serializer/deserializer circuit integrated within the integrated circuit, wherein the source follower circuit is integrated into the serializer/deserializer.

In some embodiments, the system further includes an analog-digital converter circuit integrated within the integrated circuit, wherein the source follower is integrated into the analog-digital converter circuit.

In some embodiments, the system further includes transceiver, wherein the integrated circuit is integrated into the transceiver.

In some embodiments, the transceiver is configured to operate within a cloud-based network.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are exemplary and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in a different order, unless otherwise provided in the claims. In the drawings:

DETAILED DESCRIPTION

Figure 1A:
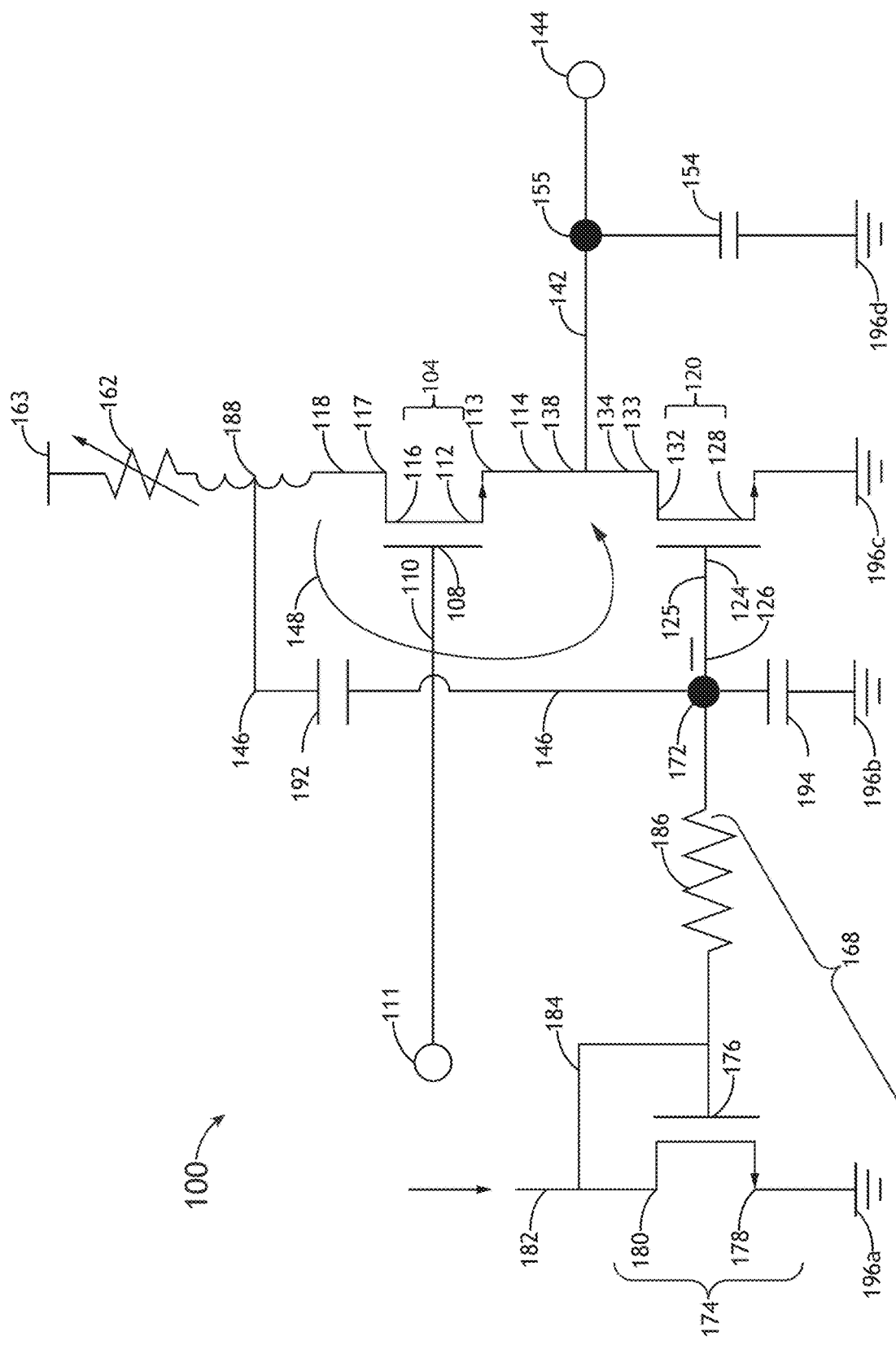
FIG. 1A is a diagram illustrating a schematic of a source follower circuit that includes a bias circuit, a first resistor, and an inductive element, in accordance with one or more embodiments of the disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in the specification do not necessarily all refer to the same embodiment, and embodiments may include one or more of the features expressly described or inherently present herein, or any combination of sub-combination of two or more such features, along with any other features which may not necessarily be expressly described or inherently present in the instant disclosure.

A source follower configured for use as a buffer in high-speed switching systems is disclosed. The source follower includes at least two transistors and a feedback loop, having some similarity to class A or class AB super source followers that also utilize two transistors and a feedback loop. However, the source follower circuit design and componentry cause the source follower to operate with higher bandwidth (e.g., the rate of data transfer across a given path) and lower settling times (e.g., the time required for an output to reach and remain within a given error band following an input) than class A or class AB super source followers. The source follower may include a first resistor configured as a feedback resistor, an inductive peaking element, and/or a bias circuit configured to receive a constant transconductance (gm) current and send a bias voltage to a gate terminal of one of the transistors. The source follower may be integrated within any circuit, such as a serializer/deserializer (SerDes) circuit or analog-digital converter (ADC) circuit and may be deposed within an integrated circuit. The source follower may be utilized within any electronic device or electronic componentry, including a transceiver.

FIG. 1A is a diagram illustrating a schematic of a source follower circuit 100, in accordance with one or more embodiments of the disclosure. The source follower includes a first transistor 104 configured with a first gate terminal 108 coupled to a first input line 110 (e.g., having a first input terminal 111), a first source terminal 112 coupled to a first end 113, of a first source line 114, and a first drain terminal 116, coupled to a first end 117 of a first drain line 118. The source follower circuit 100 further includes a second transistor 120 configured with a second gate terminal 124 coupled to a first end 125 of a second input line 126, a second source terminal 128, and a second drain terminal 132 coupled to a first end 133 of a second drain line 134. The first source line 114 and the second drain line 134 are coupled at an output junction 138 (e.g., at a second end of the first source line 114 and a second end of the second drain line 134). An output line 142 also coupled to the output junction 138, leading to an output terminal 144.

The first drain line 118 and the second input line 126 are coupled via a first path 146, creating a feedback subcircuit 148. The feedback subcircuit 148 provides a loop within the source follower circuit 100 that causes the source follower circuit 100 to behave as a fast second order system, rather than slower first order system of non-feedback source followers.

The source follower circuit 100 further includes an input terminal 152 coupled to the first input line 110. In embodiments, upon applying an input signal (Vin) at the input terminal, 152, the first transistor 104 (e.g., a common drain transistor) passes the input signal to an output loading capacitor 154 coupled to and or branching off the output line (at output junction 155). The second transistor 120 (e.g., a common source transistor) is used as a bias current source.

In embodiments, the source follower circuit 100 further includes a first resistor 162 coupled to, or branched off, the first drain line 118 (e.g., between the first end 117 of the first drain line 118 and a first drain line input 163). The first resistor 162 is oriented such that a first voltage (e.g., a feedback voltage) is generated across the first resistor 162 when the output of the source follower circuit 100 (e.g., $V_{out}$ at output terminal 144) has difficulty in tracking the input voltage Vin at high frequency (e.g., the first resistor 162 controls or limits the first voltage). For example, the voltage is generated when $V_{gs}=V_{in}-V_{out}$ of the first transistor 120, having a first transconductance gm1, changes when $V_{out}$ does not exactly follow $V_{in}$. This generated voltage is fed back through the feedback subcircuit 148 to the second gate terminal 124 of the second transistor 120, having a second transconductance gm2, where the additional current helps the output signal $V_{out}$ to "catch up" with the input signal ($V_{in}$). The first resistor 162 may be implemented in various forms including but not limited to a poly resistor, a metal resistor, a carbon-film resistor or an OD resistor. The first resistor 62 may also be performed by other componentry with resistive qualities, such as a transistor (e.g., a transistor in diode connection or in triode connection).

In some embodiments, the source follower circuit 100 includes a bias circuit 168 configured to receive a constant transconductance bias current (e.g., bias current ($gm_{bs}$)), and deliver a bias voltage ($V_{bias}$) at a bias input junction 172 (e.g., received at the second gate terminal 124). The bias circuit may include a third transistor 174 configured with a third gate terminal 176 coupled to the second input line 126, a third source terminal 178, and a third drain terminal 180 coupled to a third drain line 182, which receives the bias current input. The bias circuit 168 further includes a second path 184 coupled to the third drain line and the second input line. The bias circuit 168 may further include a second resistor 186 (e.g., bias resistor) integrated into, or disposed between, the second input line between the bias input junction 172 and the third gate terminal 176. Thus, line 126 and the gate of the second transistor 120 biased by the bias circuit 168 at DC and low frequency, and by the feedback subcircuit 148 at high frequency. The bias circuit 168 makes the transconductance gm1 of the first transistor 104 and the transconductance gm2 of the second transistor 120 constant across process, voltage and temperature (PVT) corners, which help the circuit achieve consistent performance under all operation conditions.

The incorporation of the feedback subcircuit 148 into the source follower circuit 100 introduces a high frequency pole at the bias input junction 172, which assists the low frequency pole at the output junction 155, pushing the closed-loop pole to a higher frequency. By operating at higher frequency, the source follower circuit is also operating at a higher bandwidth and with faster settling times. The first resistor 162 is tightly controlled so as to balance the loop gain and the pole frequency at the bias input junction. For example, the pole frequency at the output junction can be pushed to over 100 GHz. The first resistor 162 may be calibrated in order to determine a resistance of the first resistor 162. For example, the resistance of the first resistor 162 may be determined via a connection to an off-chip device that uses an iterative process to match the resistance of an on-chip resistor (e.g., variable resistor), or resistor block, to that of an off-chip reference resistor. Alternatively, an on-chip method for resistor calibration may be utilized. Calibrated resistors increase the predictability of the source follower circuit 100 function under a variety of conditions, decreasing overall PVT variation.

In some embodiments, the source follower circuit 100 further includes an inductive element 188, such as an inductive coil, configured to perform an inductive peaking operation. For example, the inductive element 188 may resonate with and effectively cancel the parasitic capacitance 194 at a desired high frequency. Thus, the inductive peaking may push the pole at the bias input junction 172 to a higher frequency and further expand the bandwidth of the source follower circuit 100. The inductive peaking operation may include shunt peaking, series peaking, shunt-series peaking, and/or T-coil peaking (e.g., as shown in FIG. 1A). For example, an operation that includes shunt peaking may include the source follower circuit 100 with the inductive element 188 placed in parallel with the output path. In another example, a series peaking operation may include the source follower circuit 100 with the inductive element 188 placed in series with the output path. In another example, a T-coil peaking operation may include the source follower circuit 100 utilizing a T-coil inductor to increase bandwidth via 'steering' input current into the capacitive part of the load, increasing the charging rate.

The source follower circuit 100 may include other functional componentry including but not limited to a first capacitor 192 and a second capacitor 194 or capacitance. For example, the first capacitor 192 may be configured as a relatively large capacitance capacitor 192 that is added to provide a short circuit at high frequency. In another example, the second capacitor 194 may be configured as an unintentional and relatively small parasitic capacitance derived from other devices and/or circuits. The source follower circuit 100 may also include one or more grounds 196a-d. The source follower circuit 100 may have more or fewer components as shown and as required to increase bandwidth and lower settling time for the source follower circuit 100. Therefore, the source follower circuit 100 of FIG. 1A should not be considered as a limitation of the source follower circuit 100, but as an illustration.

Figure 1B:
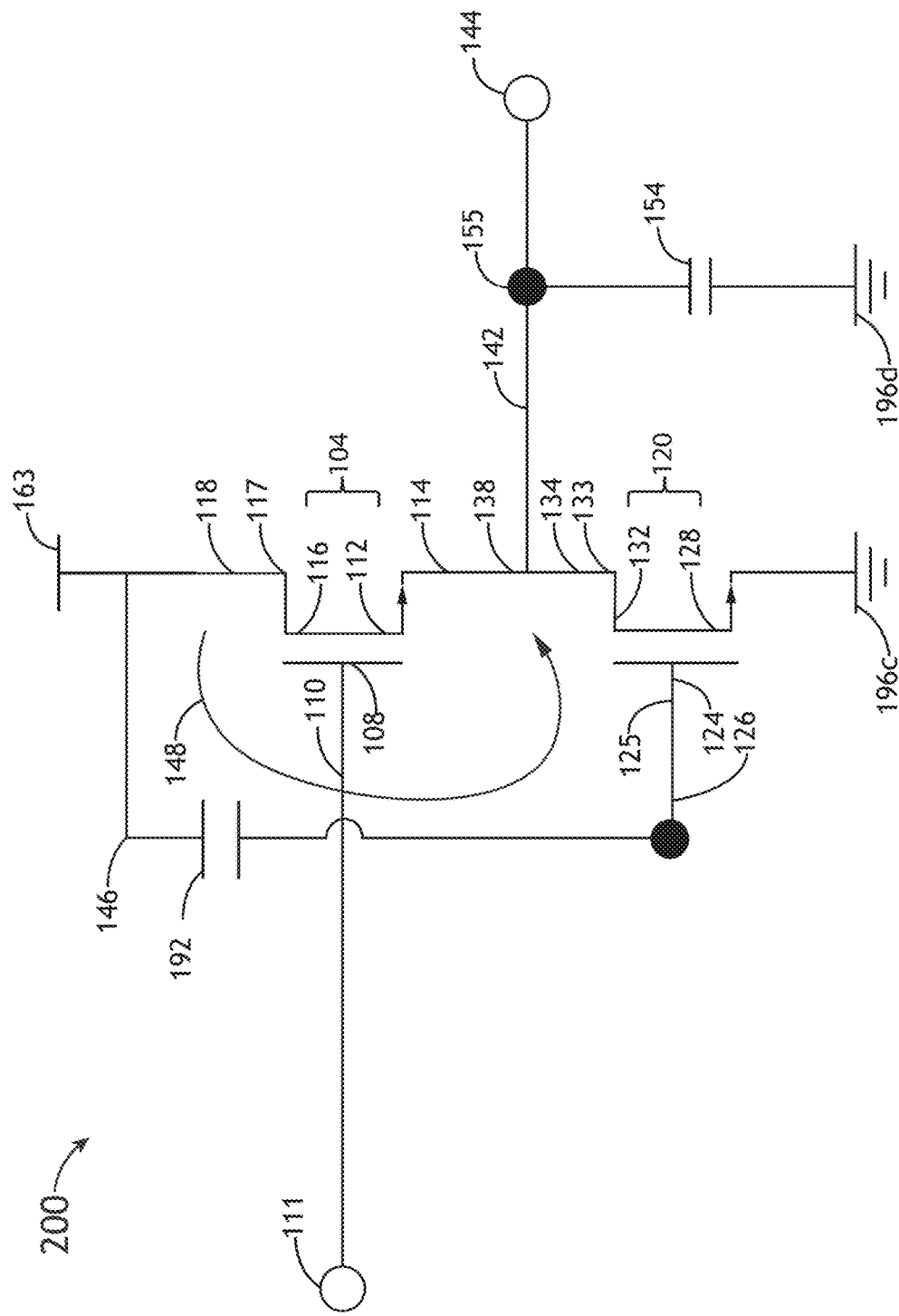
FIG. 1B is a diagram illustrating a schematic of a basic source follower circuit, in accordance with one or more embodiments of the disclosure

The addition of (1) the first resistor 162, (2) the bias circuit 168, and (3) the inductive element 188 each work to increase bandwidth and decrease settling time in the source follower circuit 100 as well as reduce process, voltage, and temperature (PVT) variations of the source follower circuit 100 as shown herein. Each of these three components may be included separately or in combination as part of a base source follower circuit 200 as shown in FIG. 1B, in accordance with one or more embodiments of the disclosure. The base source follower circuit 200 includes the first path 146 that supplies the entire voltage to the second gate terminal 124 of the second transistor 120, as the base source follower circuit 200 does not include the first resistor 162 or the inductive element 188.

Figure 1C:
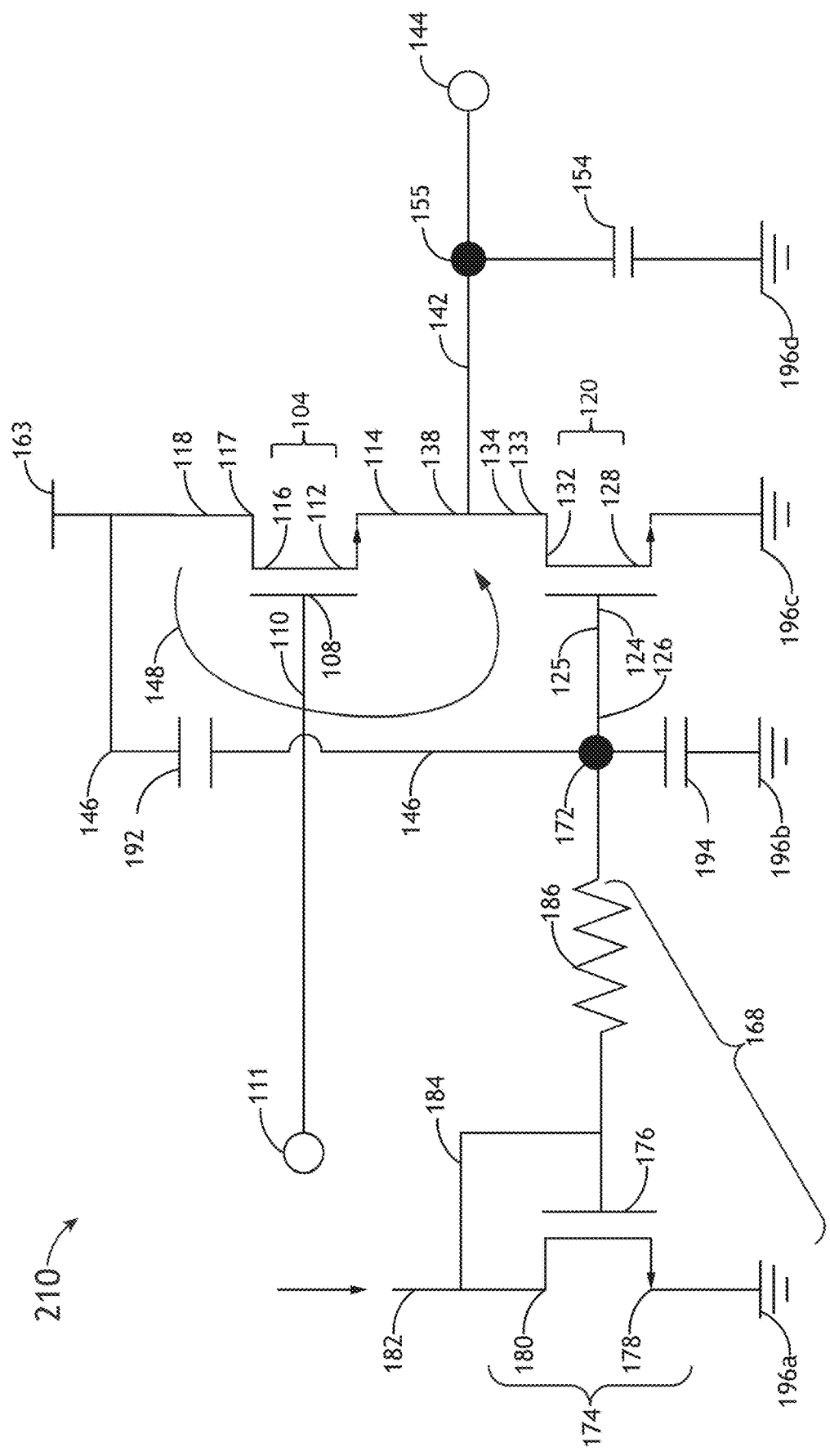
FIG. 1C is a diagram illustrating a schematic of a source follower circuit that includes a bias circuit, in accordance with one or more embodiments of the disclosure.
Figure 1D:
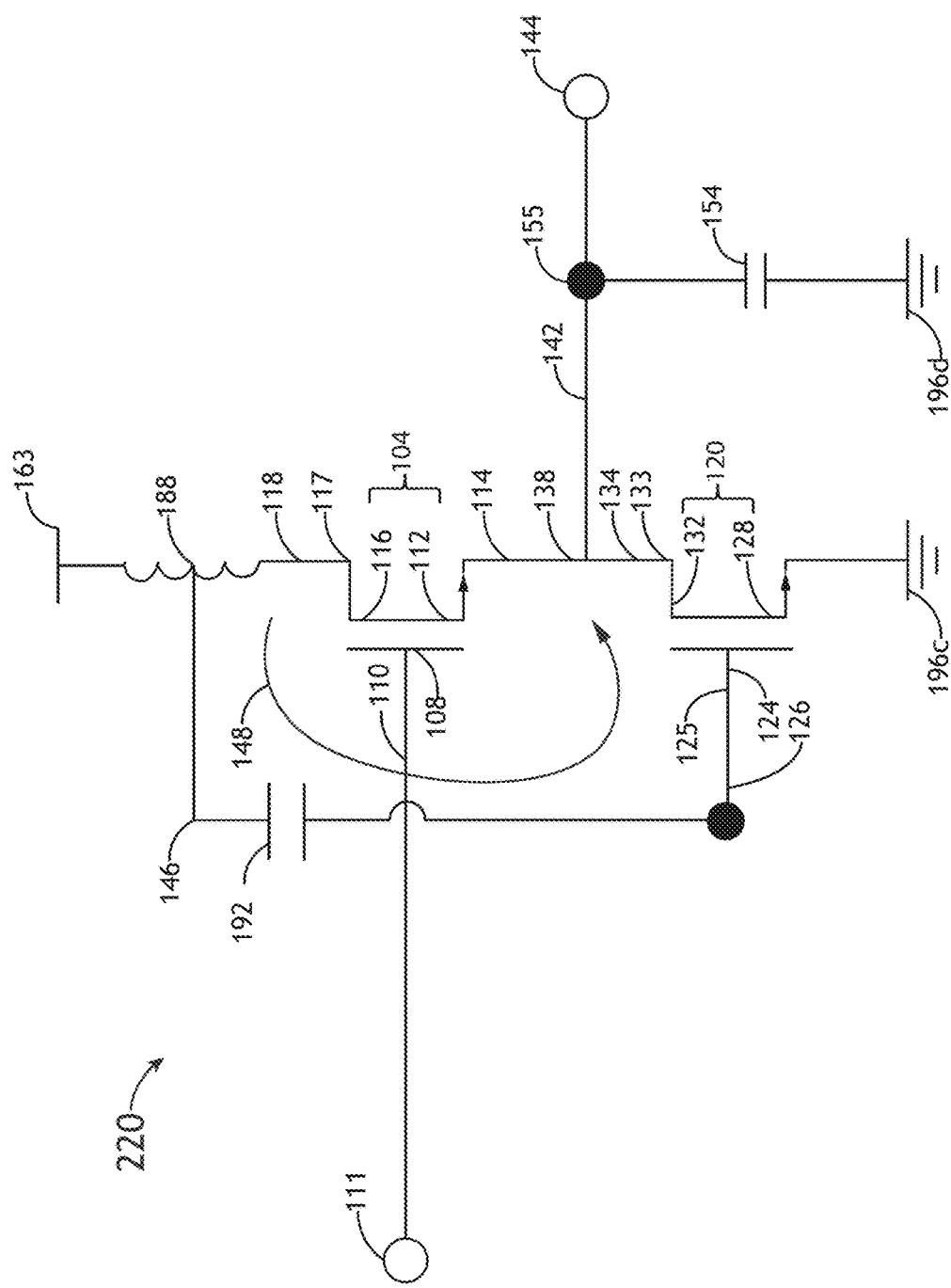
FIG. 1D is a diagram illustrating a schematic of a source follower circuit that includes an inductive element, in accordance with one or more embodiments of the disclosure.

In some embodiments, the source follower circuit 100 includes the bias circuit 168, and not the first resistor 162 or the inductive element 188, as demonstrated by source follower circuit 210 shown in FIG. 1C, in accordance with one or more embodiments of the disclosure. However, the source follower circuit 210 may be configured to include the first resistor 162 and/or the inductive element 188.

Similarly, in embodiments, the source follower circuit 100 includes the inductive element 188 and not the first resistor 162 or the bias circuit 168, as demonstrated by source follower circuit 220 shown in FIG. 2D, in accordance with one or more embodiments of the disclosure. However, the source follower circuit 220 may be configured to include the first resistor and/or the bias circuit 168.

Similarly, in embodiments, the source follower circuit 100 includes the first resistor 162 and not the inductive element 188 or the bias circuit 168, as demonstrated by source follower circuit 230 shown in FIG. 2E, in accordance with one or more embodiments of the disclosure. However, the source follower circuit 230 may be configured to include inductive element 188 (e.g., as shown in source follower circuit 240 of FIG. 1F) and/or the bias circuit 168. Accordingly, the source follower circuit 100 may have one or more, or all, components as source follower circuits 200, 210, 220, 230, 240 and vice versa.

In embodiments source follower circuit 100 is integrated into an integrated circuit. For example, the source follower circuit 100 may be integrated into an integrated circuit with transistors 104, 120 implemented into the source follower circuit 100 as complementary metal-oxide-semiconductors (CMOS), field-effect transistors (FET), or metal-oxide-semiconductor field-effect transistors (MOSFET). For instance, the MOSFETs can be implemented as either NMOS or PMOS, depending on design approach. Similarly, $V_{DD}$ and ground ($V_{SS}$) can be switched, depending on implementation of the source follower circuit 100.

It should be understood that the source follower circuit 100 may also be configured into a non-integrated circuit setting. For example, the source follower circuit 100 may be implemented with transistors 104, 120 configured as bipolar junction transistors or junction-gate field effect transistors. Therefore, the above description is intended not as a limitation, but as an illustration.

Figure 5:
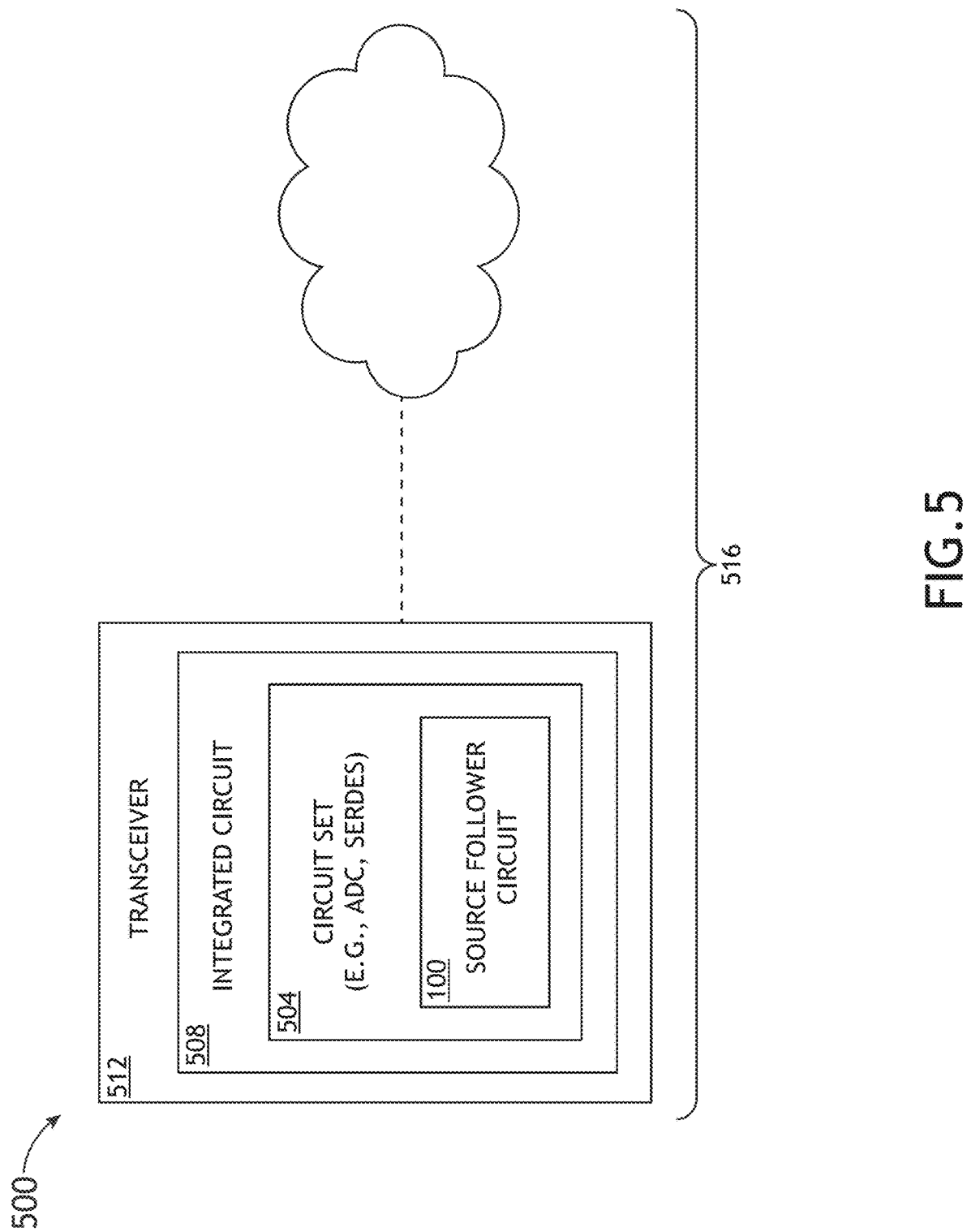
FIG. 5 is a block diagram illustrating the organization of a source follower circuit within a device such as a transceiver, in accordance with one or more embodiments of the disclosure.

In embodiments, the source follower circuit 100 may be implemented into larger circuit organizations and devices as shown in FIG. 5, in accordance with one or more embodiments of the disclosure. For example, the source follower circuit 100 may be implemented within a circuit set 504 that is itself integrated within an integrated circuit 508. For instance, the circuit set may be configured as a SerDes circuit. In another example, the circuit set 504 may be implemented as an analog-digital converter (ADC). Many other implementations of the source follower circuit 100 into electronic components are possible. The source follower circuit 100 may also be implemented within many types of electronic devices including but not limited to a transceiver 512, such as an optical transceiver, operating within a communication network 516, such as a cloud-based network. For example, the cloud-based network may be configured as an information technology (IT) infrastructure in which some or all of an organization's network capabilities and resources are hosted in a public or private platform, such as a set of server computers and corresponding data transfer hardware (routers), which are managed in-house or by a service provider, and are available on demand. For instance, the source follower circuit 100 may be configured as a SerDes circuit within an optical transceiver that transmits and receives data within the cloud-based network.

The source follower circuit 100 has advantages of bandwidth and settling speed as compared to known source follower circuits and known super course follower circuits. For example, the source follower circuit 100 may be implemented within an ADC, achieving a bandwidth greater than 50 GHz and a settling time less than 30 picoseconds (ps). In another example, the source follower circuit 100 may be implemented within an optical transceiver, with switch rate equal to or greater than 1.2 terabyte/sec (Tb/s). For instance, the optical transceiver may include ADCs that include the source follower circuit 100, with the ADCs performing 180 or greater GS/s with a bandwidth of 65 GHz or greater. In another instance, the transceiver may be configured as a cloud-based transceiver (e.g., configured to integrated within a distributed computing environment/network). In another example, the source follower circuit 100 may be utilized in 100G and/or 200G SerDes applications. The source follower circuit 100 can perform under low power conditions, as there is no power overhead as compared to conventional source followers.

Figure 1E:
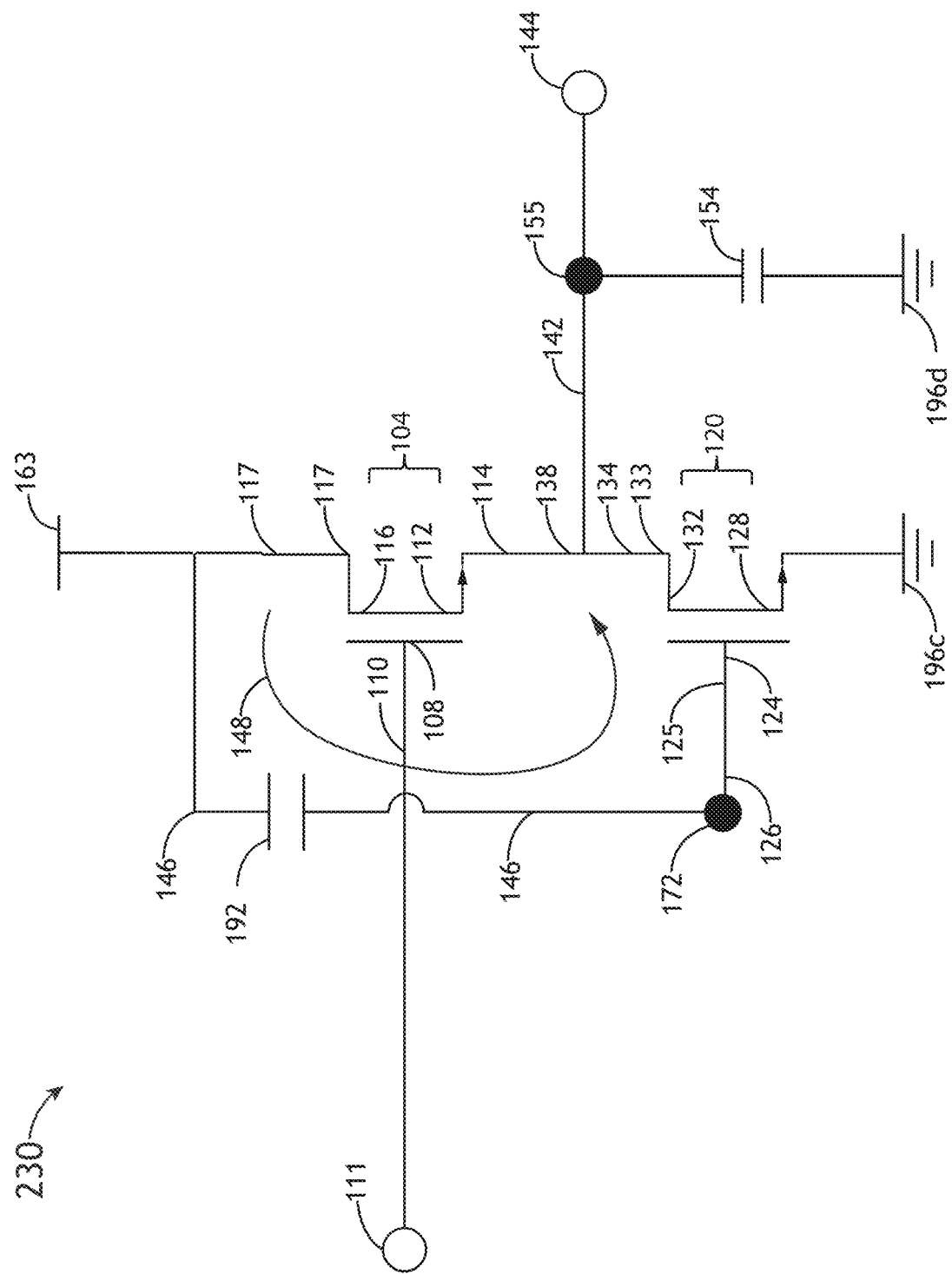
FIG. 1E is a diagram illustrating a schematic of a source follower circuit that includes a first resistor, in accordance with one or more embodiments of the disclosure.
Figure 1F:
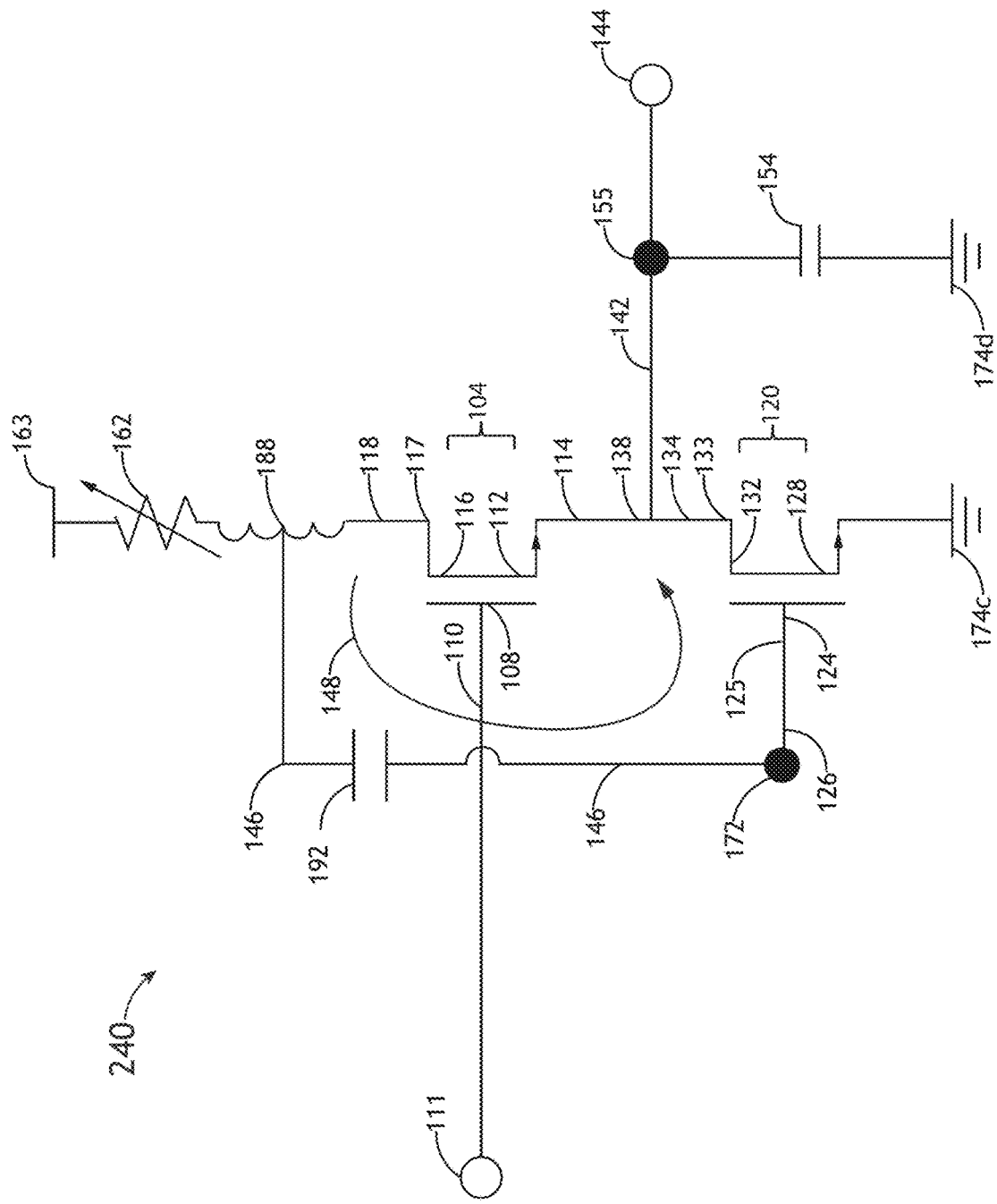
FIG. 1F is a diagram illustrating a schematic of a source follower circuit that includes a first resistor and an inductive element, in accordance with one or more embodiments of the disclosure.
Figure 2A:
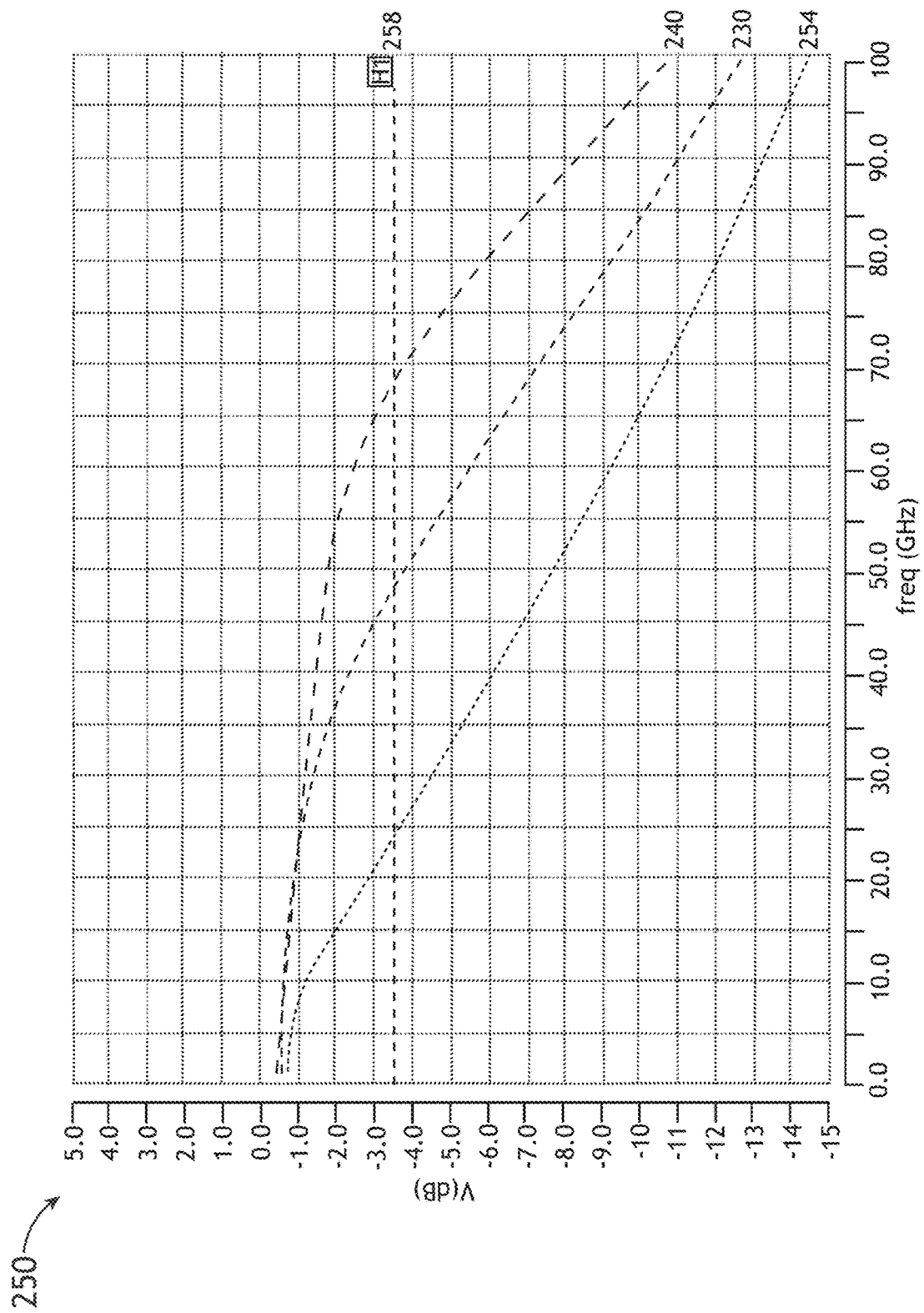
FIG. 2A is a graph illustrating the ability of different source follower circuits to achieve bandwidths at various power levels, in accordance with one or more embodiments of the disclosure.
Figure 2B:
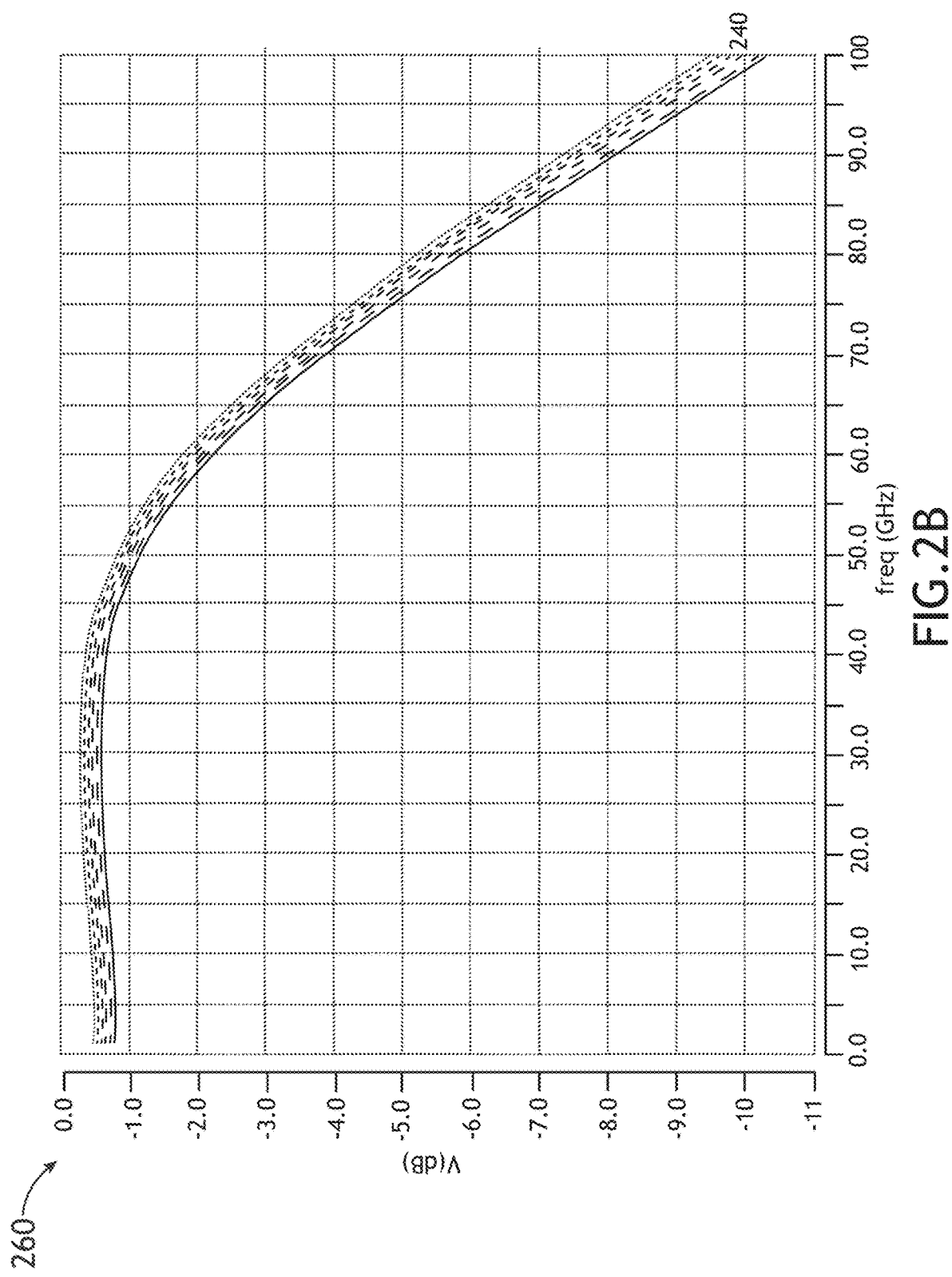
FIG. 2B is a graph illustrating the bandwidth of a source follower circuit under different power levels and conditions, in accordance with one or more embodiments of the disclosure.

FIG. 2A is a graph 250 illustrating the ability of different source follower circuits to achieve bandwidths at the same power consumption, in accordance with one or more embodiments of the disclosure. The graph 250 compares the frequency response of the source follower circuit 240, which includes the inductive element and first resistor as shown in FIG. 1F, and the frequency response of the source follower circuit 230 of FIG. 1E to the frequency response of a conventional source follower circuit 254 (e.g., a source follower circuit without the first path 146, the first resistor 162, the inductive element 188, and the bias circuit 168). Both source follower circuits 230, 240 present higher bandwidths (e.g., 50 GHz and 70 GHz, respectively) at a base power level 258 (e.g., approximately −3.0 dB below that at low frequency, also referred to as the 3 dB bandwidth) than the corresponding bandwidth of the conventional source follower circuits 254 at the same power levels (e.g., 25 GHz). The addition and combination of components of the source follower circuit 100 (e.g., first resistor 162, first path 146, inductive element 188, and/or bias circuit 168) therefore add bandwidth capability to the source follower circuit 100. The source follower circuit 240 demonstrates considerable stability and consistency, as shown in the graph 260 of FIG. 2B, which tracks several analyses of the source follower circuit 240 under different conditions (e.g., showing the AC response at different PVT corners).

Figure 3:
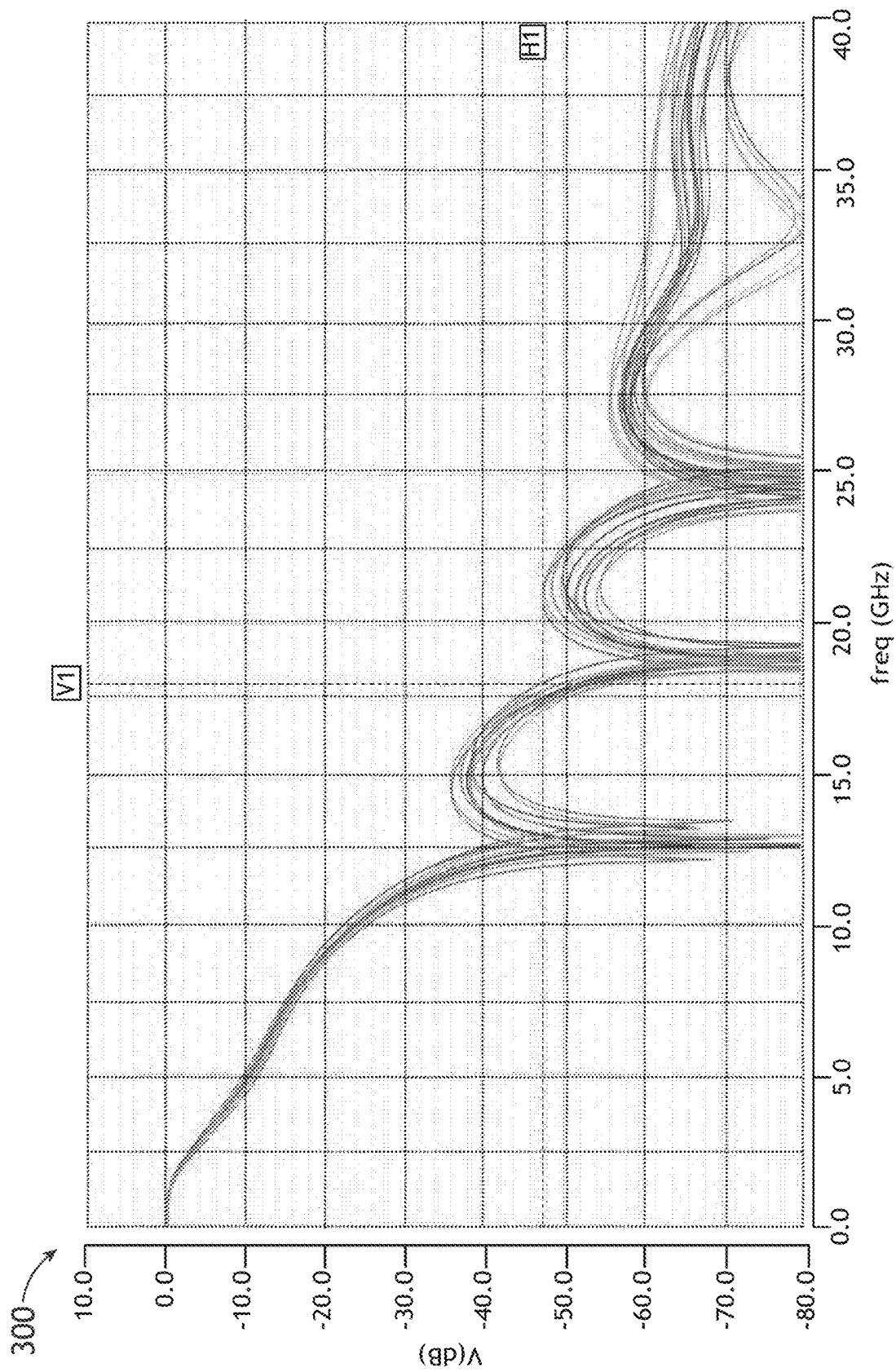
FIG. 3 is a graph illustrating the cycling speed of a source follower circuit, in accordance with one or more embodiments of the disclosure.

FIG. 3. is a graph 300 illustrating the cycling speed of the source follower circuit 240, in accordance with one or more embodiments of the disclosure (e.g., the X-axis presenting time in picoseconds (ps) and Y-axis presenting amplitude measured as output in log scale. The graph 300 represents the time that an output voltage (e.g., 20 mV) will settle to a value close to a final value (e.g., a residual error of −48 dB) when the input voltage toggles. As shown in graph 30, the residual error reduces to the threshold value within a window of 18 ps. For an ADC constructed using the source follower circuit 240, an 18 ps settling time would correspond to a switching rate of 180 GS/s. Graph 300 presents several runs of the source follower circuit 240 at several conditions (e.g., showing the settling time at PVT corners).

Figure 4:
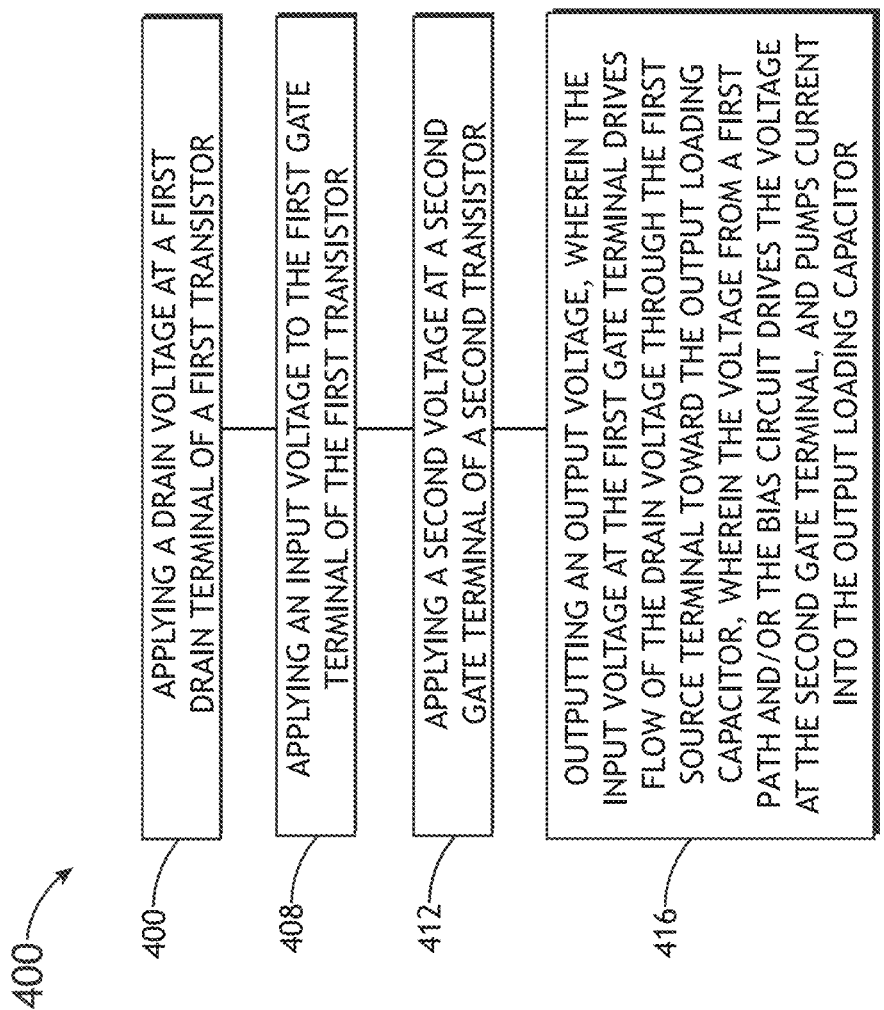
FIG. 4 is a flow chart illustrating a method for operating the source follower circuit 100, in accordance with one or more embodiments of the disclosure.

FIG. 4 is a flow chart illustrating a method 400 for operating the source follower circuit 100, in accordance with one or more embodiments of the disclosure. The method 400 describes the use of source follower circuit 100, and one or more, or all, steps of the method 400 describe the use of source follower circuits 200, 210 220, 230, 240.

In embodiments, the method 400 include a step 404 of applying a drain voltage ($V_{DD}$). For example, the drain voltage may be applied at the first drain line input 163 leading to the first drain terminal 116 of the first transistor 104.

In embodiments, the method 400 further includes a step 408 of applying an input voltage ($V_{in}$) to the first gate terminal 108 of the first transistor 104. For example, an input voltage may be applied to the first input terminal 111. The first transistor 104 is configured as a common-drain transistor, which passes the input voltage at the first gate terminal 108 to the output loading capacitor 154.

In embodiments, the method 400 further includes a step 412 of applying a second voltage at a second gate terminal 124 of a second transistor 120. The second voltage includes a bias voltage ($V_{bias}$) that may originate from a bias circuit 168. The second voltage may also include voltage originating from the first path 146 that branches off of the first drain line 118.

In embodiments, the method further includes a step 416 of outputting an output voltage. As described herein, the input voltage at the first gate terminal 108 drives flow of the drain voltage through the first source terminal 112 toward the output loading capacitor. The voltage from the first path 146 and/or the bias circuit 168 (e.g., the second input voltage) drives the voltage at the second gate terminal 124, and pumps current into the output loading capacitor 154, which helps the output voltage to "catch up" with the input voltage, extending the bandwidth of the source follower circuit 100.

It should be understood that terms coupling, "connected to", "coupled to", "disposed between", and other connective wording that describe a link between two or more elements or components are intended to describe both indirect and direct connections unless otherwise stated. For example, a first element coupled to a second element may be coupled via any number of interleaving components or elements (e.g., 0, 1, or 100). In another example, a set of components that includes a first component disposed between a second component and a third components may also include any number of components or elements (e.g., 0, 1, or 100) that are also disposed between the second component and the third component. Therefore, the above description is intended not as a limitation, but as an illustration.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing and figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A system comprising:
    a source follower circuit, comprising:
        a first transistor comprising:
            a first gate terminal configured to receive a first voltage via a first input line;
            a first source terminal coupled to a first end of a first source line; and
            a first drain terminal coupled to a first end of a first drain line;
        a second transistor comprising:
            a second gate terminal configured to receive a second voltage via a first end of a second input line;
            a second source terminal; and
            a second drain terminal coupled to a first end of a second drain line;
        an output junction formed from a second end of the first source line, and a second end of the second drain line;
        a feedback subcircuit comprising a first path coupled to the first end of the first drain line and coupled to the second input line; and
        an inductive element coupled to the feedback subcircuit configured to cancel a parasitic capacitance coupled to the second gate terminal at a predetermined frequency range.

2. The system of claim 1 wherein the source follower circuit further comprises a bias circuit coupled to the second input line configured to receive a bias current and send the second voltage to the second gate terminal.

3. The system of claim 2, wherein the bias circuit comprises:
    a third transistor comprising:
        a third gate terminal coupled to the second input line;
        a third source terminal; and
        a third drain terminal coupled to a third drain line, wherein the third drain line is configured to receive the bias current;
    a second path coupled to the third drain line and the second input line; and
    a second resistor disposed between the third gate terminal and the second gate terminal.

4. The system of claim 2, wherein the source follower circuit further comprises a first resistor coupled to the first drain line configured to generate a first voltage, wherein the first voltage drives a gate terminal of the second transistor.

5. The system of claim 4, wherein the source follower circuit further comprises an inductive element coupled to the feedback subcircuit configured to perform an inductive peaking operation.

6. The system of claim 2, wherein the source follower circuit further comprises an inductive element coupled to the feedback subcircuit configured to perform an inductive peaking operation.

7. The system of claim 1, wherein the source follower circuit further comprises a first resistor coupled to the first drain line configured to generate a first voltage, wherein the first voltage drives the second gate terminal.

8. The system of claim 7, wherein the first resistor is calibrated.

9. The system of claim 1, wherein the inductive element is coupled to the feedback subcircuit configured to perform an inductive peaking operation.

10. The system of claim 9, wherein the inductive element is configured as an inductive coil.

11. The system of claim 1, further comprising an integrated circuit, wherein the source follower circuit is integrated into the integrated circuit.

12. The system of claim 11, further comprising a serializer/deserializer circuit integrated within the integrated circuit, wherein the source follower circuit is integrated into the serializer/deserializer.

13. The system of claim 11, further comprising an analog-digital converter circuit integrated within the integrated circuit, wherein the source follower circuit is integrated into the analog-digital converter circuit.

14. The system of claim 11, further comprising a transceiver, wherein the integrated circuit is integrated into the transceiver.

15. The system of claim 14, wherein the transceiver is configured as an optical transceiver.

16. The system of claim 14, wherein the transceiver is configured to operate within a cloud-based network.

17. A system comprising:
    a source follower circuit, comprising:
        a first transistor comprising:

a first gate terminal configured to receive a first voltage via a first input line;

a first source terminal coupled to a first end of a first source line; and a first drain terminal coupled to a first end of a first drain line;

a second transistor comprising:

a second gate terminal configured to receive a second voltage via a first end of a second input line;

a second source terminal; and a second drain terminal coupled to a first end of a second drain line;

an output junction formed from a second end of the first source line and a second end of the second drain line;

a feedback subcircuit comprising a first path coupled to the first end of the first drain line and coupled to the second input line;

a bias circuit coupled to the second input line configured to receive a bias current and send the second voltage to the second gate terminal;

a first resistor coupled to the first drain line configured to generate a first voltage, wherein the first voltage drives a gate terminal of the second transistor; and an inductive element coupled to the feedback subcircuit configured to cancel a parasitic capacitance coupled to the second gate terminal at a predetermined frequency range.

18. The system of claim 17, wherein the bias circuit comprises:

a third transistor comprising:

a third gate terminal coupled to the second input line;

a third source terminal; and a third drain terminal coupled to a third drain line, wherein the third drain line is configured to receive the bias current;

a second path coupled to the third drain line and the second input line; and a second resistor disposed between the third gate terminal and the second gate terminal.

19. The system of claim 18, wherein the inductive element is configured as an inductive coil.

20. The system of claim 19, further comprising an integrated circuit, wherein the source follower circuit is integrated into the integrated circuit.

* * * * *